(12) United States Patent
Ehrichs et al.

(10) Patent No.: US 6,806,111 B1
(45) Date of Patent: Oct. 19, 2004

(54) SEMICONDUCTOR COMPONENT AND METHOD OF MANUFACTURE

(75) Inventors: Edward E. Ehrichs, Austin, TX (US); Mark B. Fuselier, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/325,909

(22) Filed: Dec. 19, 2002

(51) Int. Cl.[7] .................... H01L 21/00; H01L 21/4763
(52) U.S. Cl. .......................... 438/29; 438/31; 438/98; 438/618
(58) Field of Search ............... 438/27, 29, 31, 438/98, 618, 622; 257/82, 83, 98, 99

(56) References Cited

U.S. PATENT DOCUMENTS

| | | | |
|---|---|---|---|
| 5,466,948 A | 11/1995 | Worley | 257/3 |
| 5,710,852 A * | 1/1998 | Weber | 385/123 |
| 6,150,188 A | 11/2000 | Geusic et al. | 438/31 |
| 6,353,264 B1 | 3/2002 | Coronel et al. | 257/777 |
| 6,393,183 B1 | 5/2002 | Worley | 385/39 |
| 6,552,407 B1 * | 4/2003 | Hayashi et al. | 257/507 |
| 2001/0002221 A1 | 5/2001 | Nagata | 385/129 |
| 2001/0045613 A1 | 11/2001 | Nagata | 257/510 |
| 2002/0145791 A1 | 10/2002 | Cheng et al. | 359/288 |
| 2003/0015707 A1 * | 1/2003 | Bosco et al. | 257/73 |
| 2003/0021538 A1 * | 1/2003 | Yamamoto | 385/49 |

OTHER PUBLICATIONS

"Amorphous Silicon Photodetectors for Silicon Based Optical Waveguides" by Maiello et al., published in Solid State Phenomena, vol. 54 (1997), pp. 45–49.

* cited by examiner

Primary Examiner—T. N. Quach
(74) Attorney, Agent, or Firm—Paul Drake; Rennie Wm. Dover

(57) ABSTRACT

A semiconductor component having an optical interconnect formed thereover and a method for manufacturing the semiconductor component. The semiconductor component has a transistor coupled to a light emitting device and another transistor coupled to a light detecting device by a metallization system. The light emitting device is optically coupled to the light detecting device by an optical interconnect formed over the transistors and the metallization system.

17 Claims, 9 Drawing Sheets

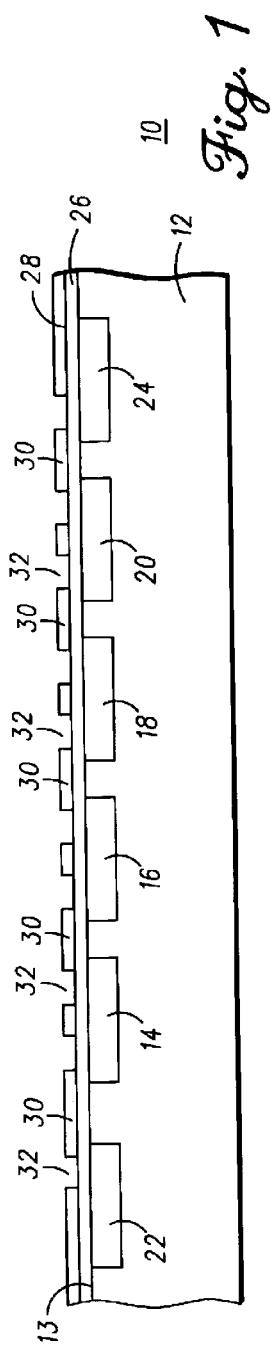
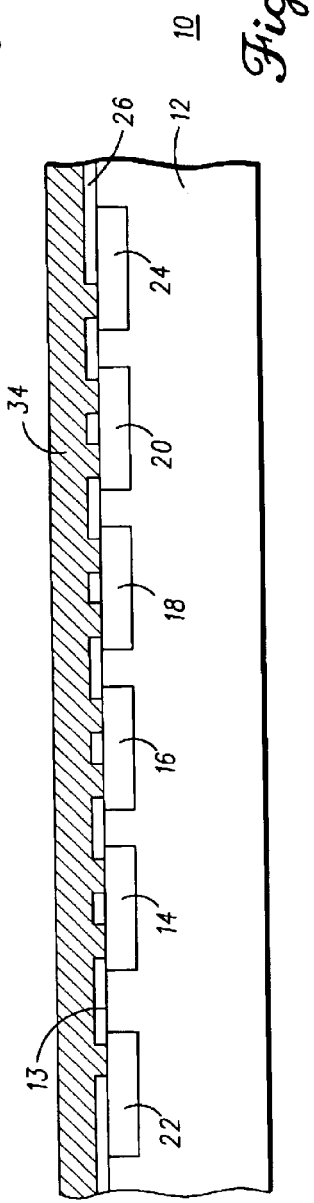
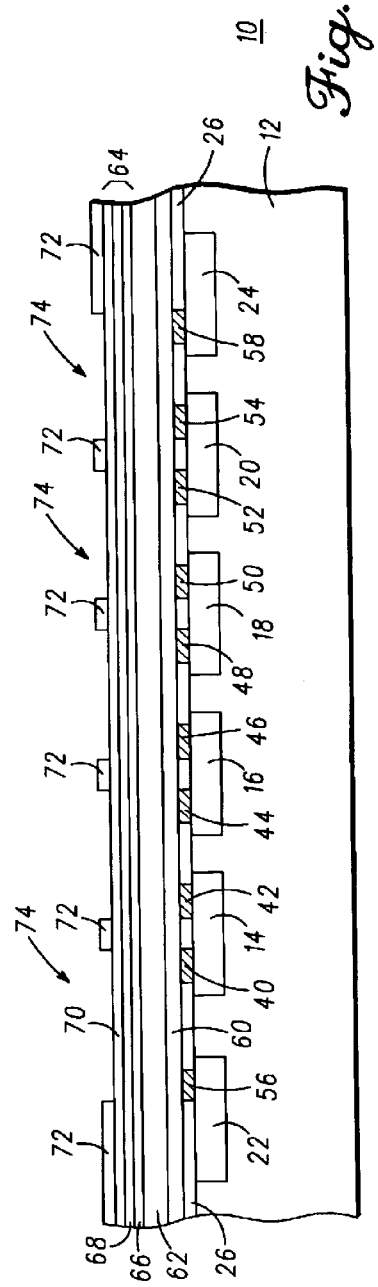

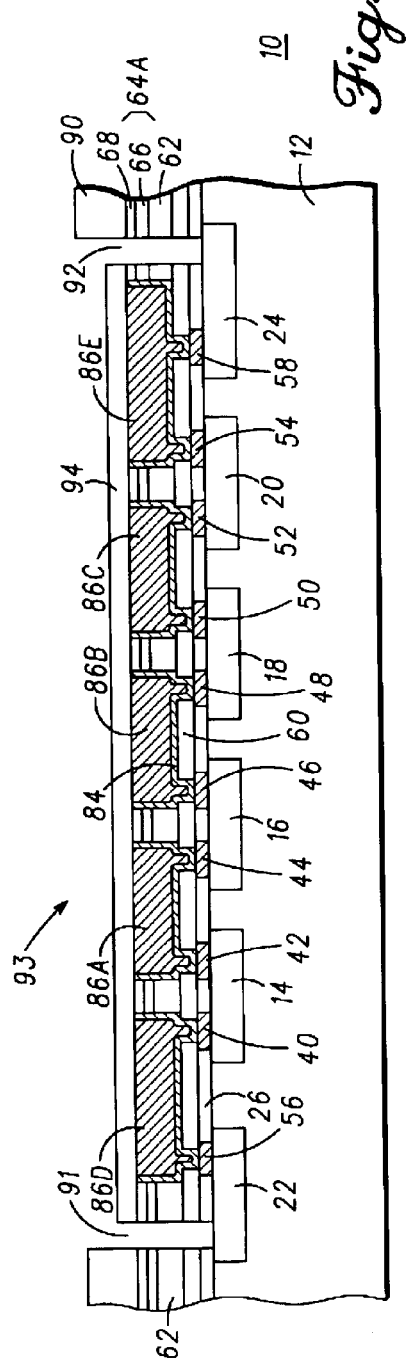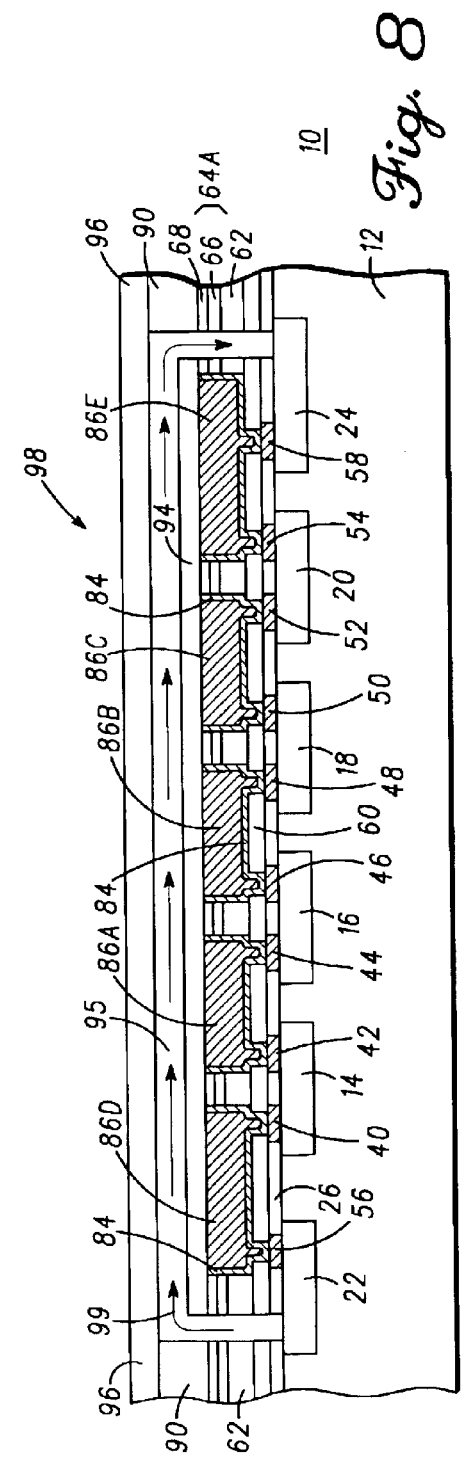

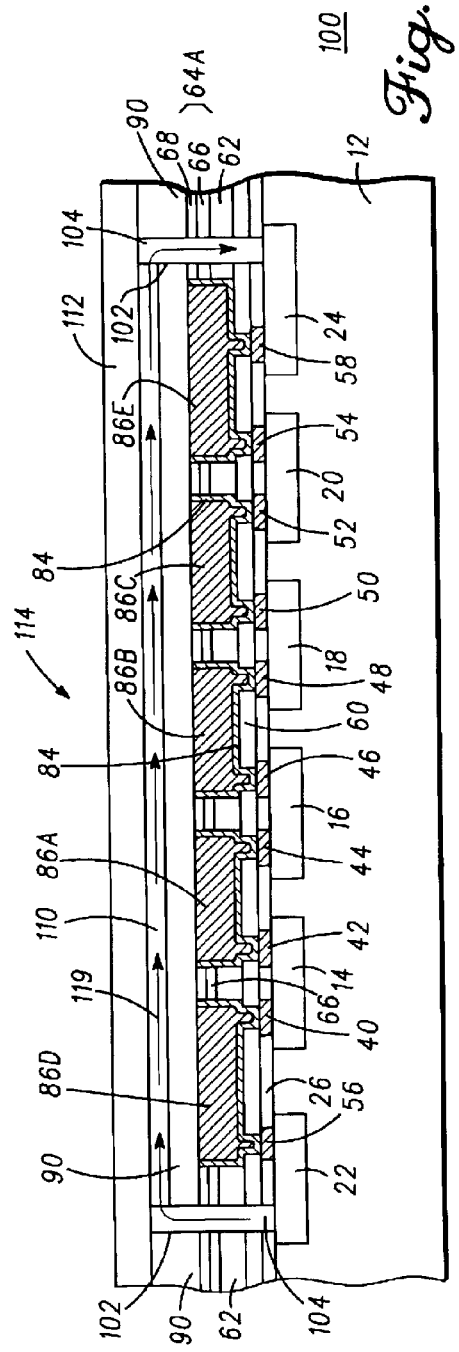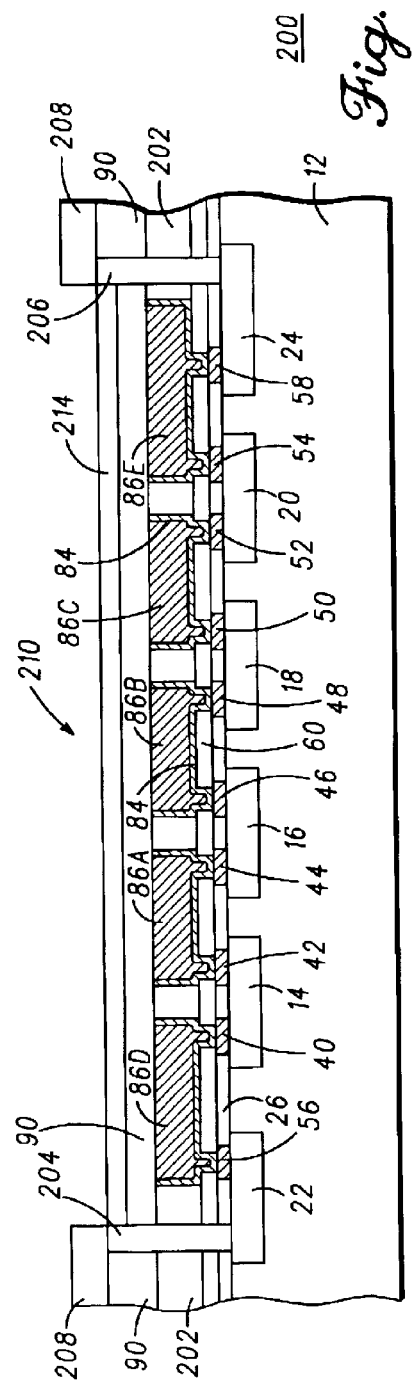

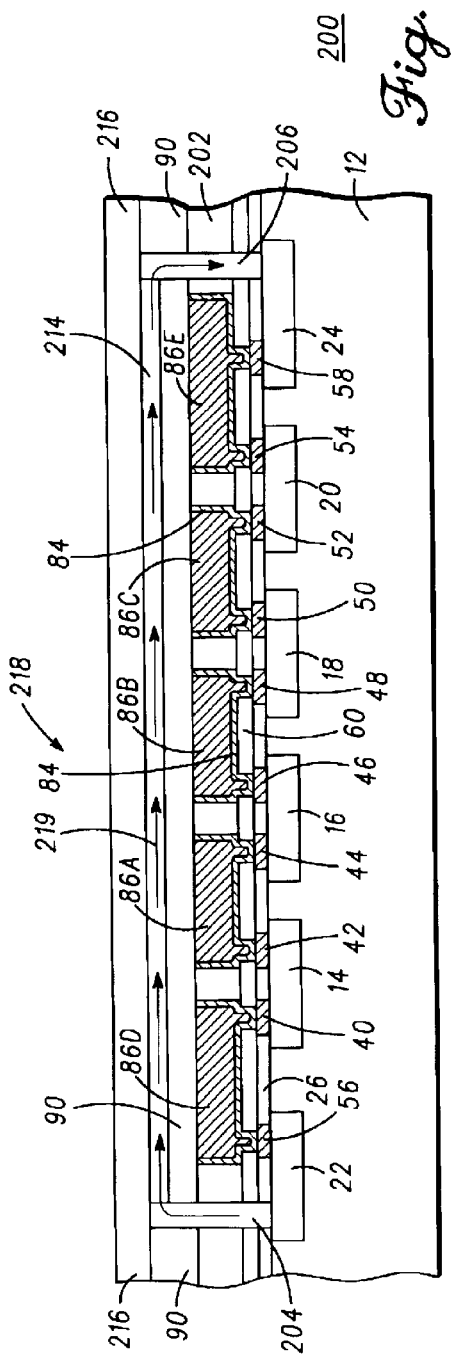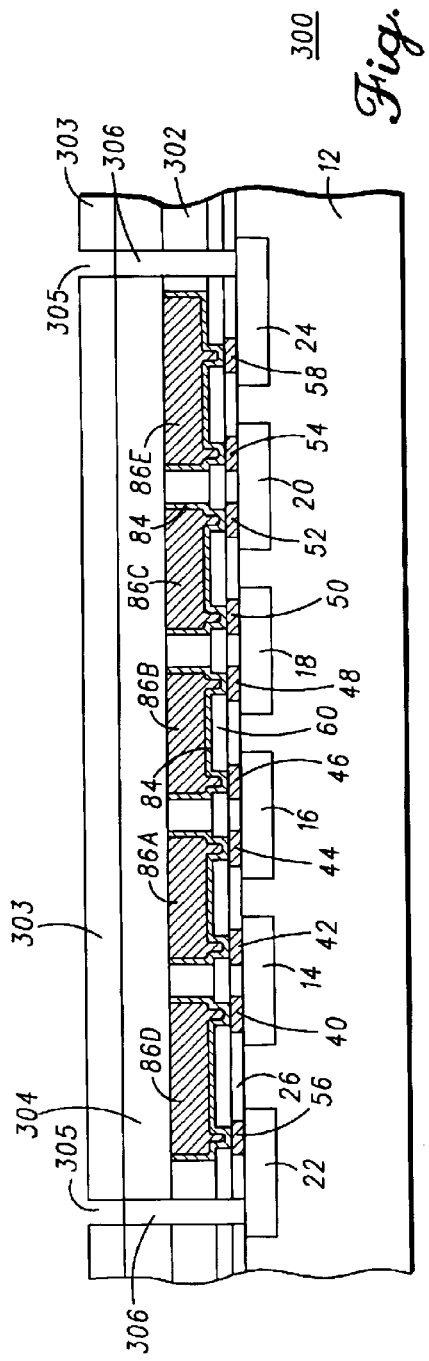

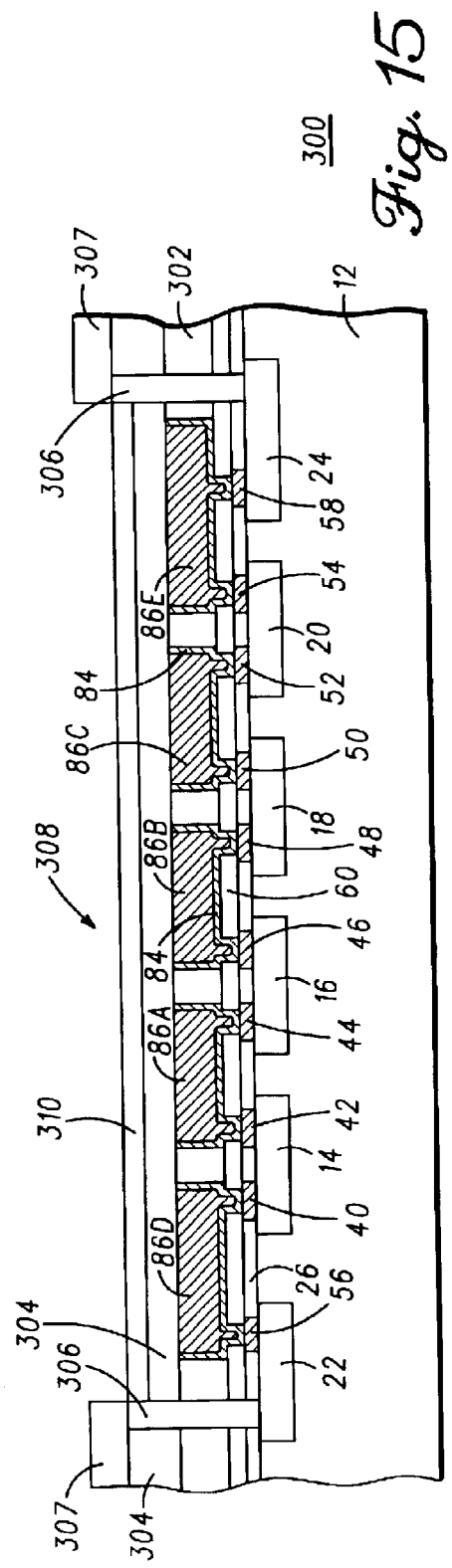
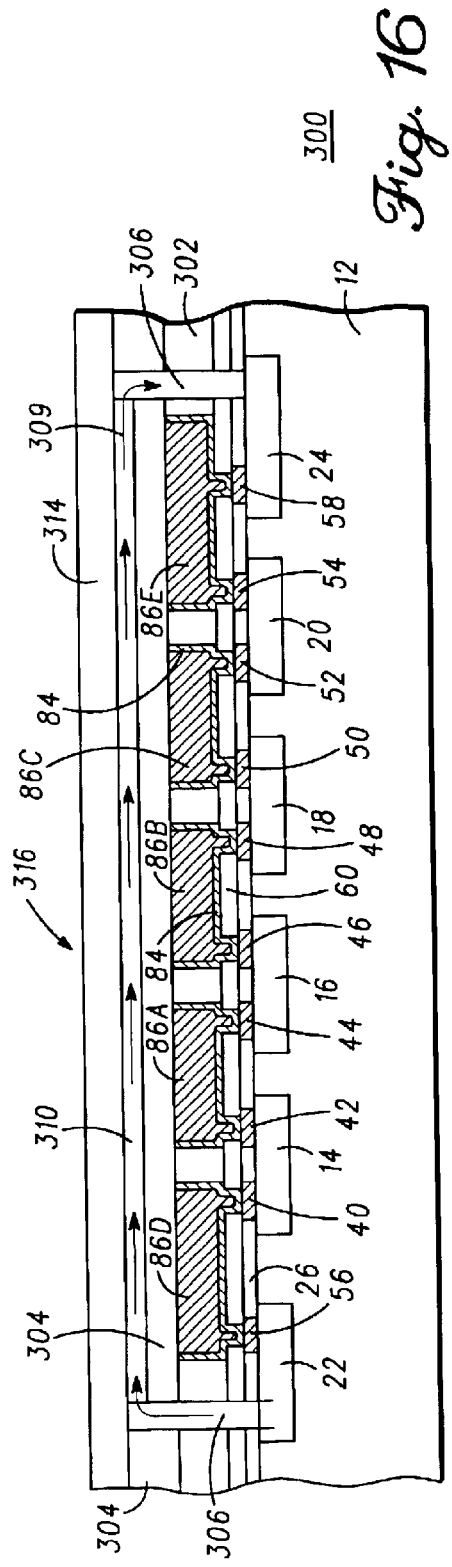

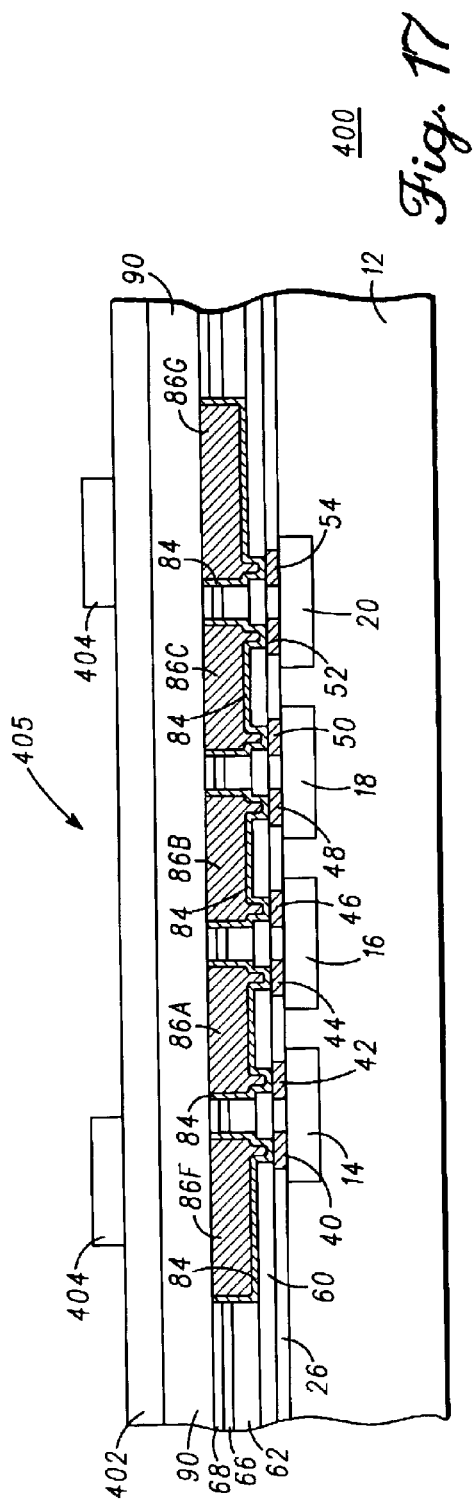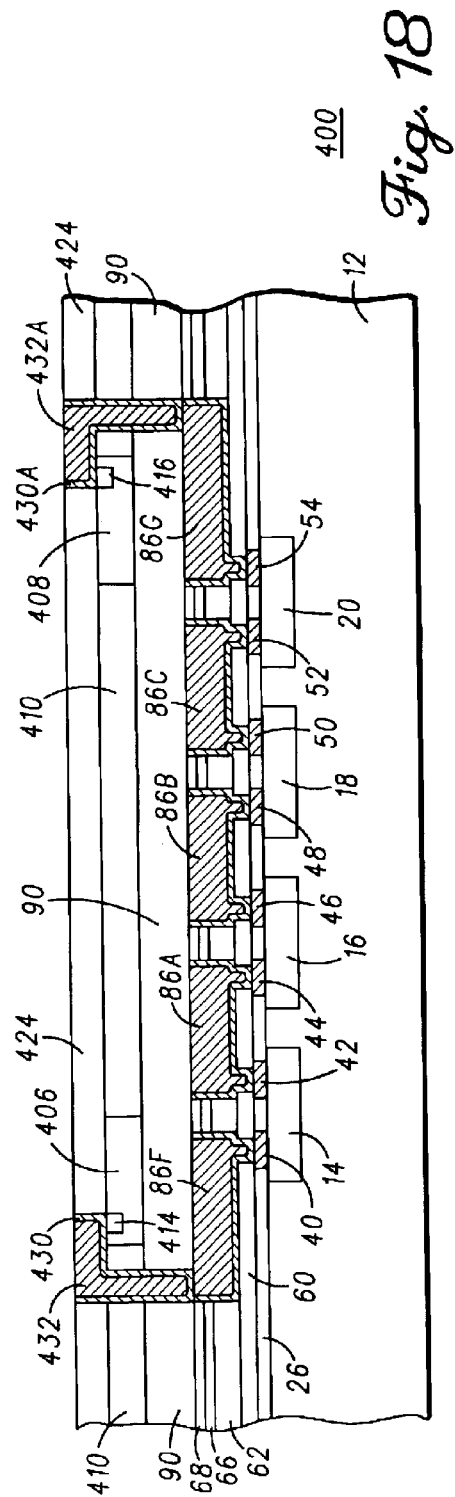

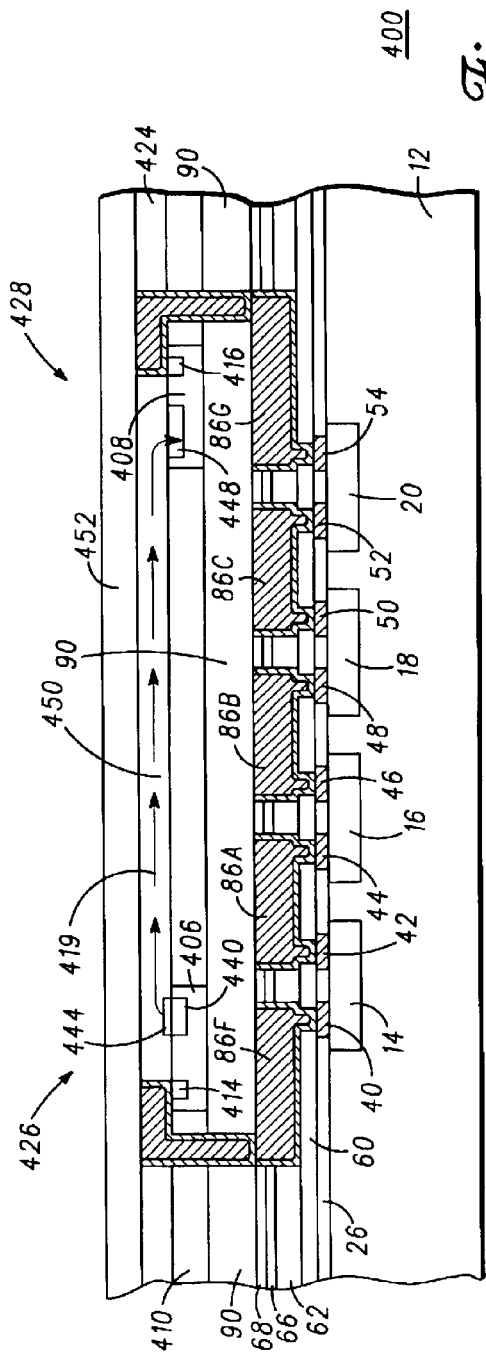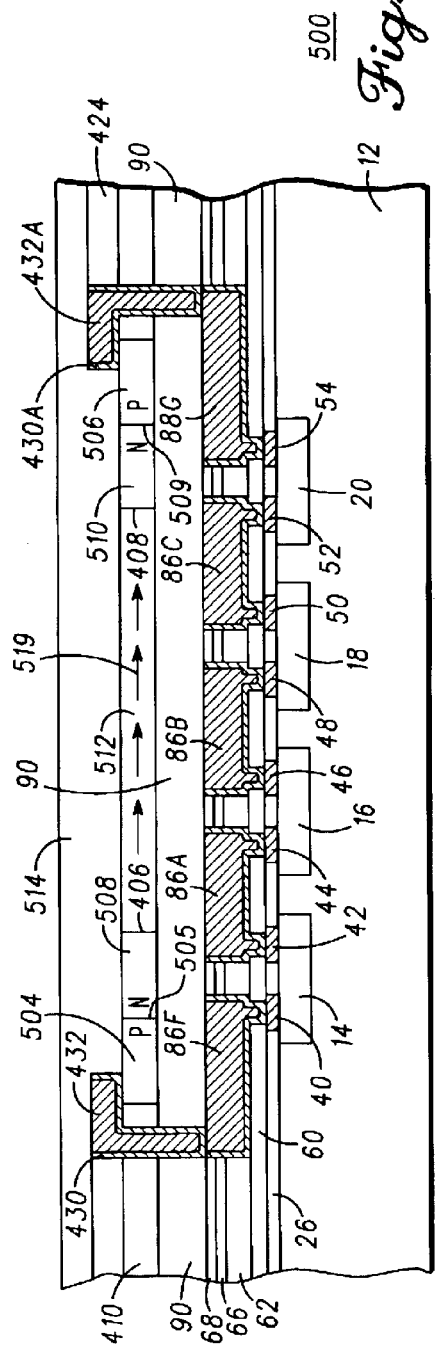

SEMICONDUCTOR COMPONENT AND METHOD OF MANUFACTURE

FIELD OF THE INVENTION

This invention relates, in general, to semiconductor components and, more particularly, to semiconductor components having optical interconnects.

BACKGROUND OF THE INVENTION

Semiconductor component manufacturers are constantly striving to increase the speed of their components. Because a semiconductor component, such as a micropro csur, contains up to a billion transistors or devices, the focus for increasing speed has been to decrease gate delays of the semiconductor devices that make up the semiconductor component As a result, the gate delays have been decreased to the point that speed is now primarily limited by the propagation delay of the metallization system used to interconnect the semiconductor devices with each other and with elements external to the semiconductor component. Metallization systems are typically comprised of a plurality of interconnect layers vertically separated from each other by a dielectric material and electrically coupled to each other by metal-filled vias or conductive plugs. Each layer contains metal lines, metal-filled vias, or combinations thereof separated by an insulating material. A figure of merit describing the delay of the metallization system is its Resistorapacitance (RC) delay. The RC delay can be derived from the resistance of the metal layer and the associated capacitance within and between different layers of metal in the metallization system.

Techniques for decreasing the RC delay of a metal interconnect include: decreasing the resistivity of the metallic interconnect layers, decreasing the resistivity of the conductive plugs that electrically couple the interconnect layers to each other, decreasing the dielectric constant of the dielectric material, decreasing the length of the metallic interconnect, increasing the thickness of the metal, increasing the thickness of the dielectric material, or combinations thereof. However, the inherent physical constraints of the metal and dielectric materials limit how much they can be adjusted and still provide a semiconductor component that meets the desired performance specifications. For example, if the length of the metallic interconnect is too short, costly designs may be needed to interconnect devices while adhering to specified design rules. Or, increasing the thickness of the metal or the dielectric material may create such a non-planar surface topography that the metal interconnects become shorted or opened. Moreover, metals with low resistivities or dielectric materials with low dielectric constants may require additional processing steps that increase both the complexity and cost of manufacturing the semiconductor components.

Accordingly, what is needed is a semiconductor component having a signal transmission structure that reduces the limitations of a metal-dielectric interconnect stack and a method for manufacturing the semiconductor component.

SUMMARY OF THE INVENTION

The present invention satisfies the foregoing need by providing a semiconductor component and a method for manufacturing the semiconductor component capable of on-chip optical communication. In accordance with one aspect, the present invention includes a method for manufacturing a semiconductor component having an on-chip waveguide or optical interconnect. A semiconductor substrate is provided having a semiconductor device such as, for example, a transistor formed therefrom. A light emitting device and a light detecting device are formed from or over the semiconductor substrate and are coupled to each other via an optical interconnect. The semiconductor device is coupled to at least one of the light emitting device and the light detecting device.

In accordance with another aspect, the present invention comprises a semiconductor component having an optical interconnect structure. The semiconductor component includes a light emitting device, a light detecting device, a semiconductor device, and the optical interconnect monolithically integrated to form the semiconductor component. The optical interconnect is above the semiconductor device and couples the light emitting device to the light detecting device.

BRIEF DESCRIPTION OF THE DRAWINGS

The present invention will be better understood from a reading of the following detailed description taken in conjunction with the accompanying drawing figures in which like references designate like elements and in which:

FIGS. 1–8 are enlarged cross-sectional side views of a semiconductor component during manufacture in accordance with an embodiment of the present invention;

FIGS. 9–11 are enlarged cross-sectional side views of a semiconductor component during manufacture in accordance with another embodiment of the present invention;

FIGS. 12–13 are enlarged cross-sectional side views of a semiconductor component during manufacture in accordance with yet another embodiment of the present invention;

FIGS. 14–16 are enlarged cross-sectional side views of a semiconductor component during manufacture in accordance with yet another embodiment of the present invention;

FIGS. 17–19 are enlarged cross-sectional side views of a semiconductor component during manufacture in accordance with yet another embodiment of the present invention; and FIG. 20 is an enlarged cross-sectional side view of a semiconductor component during manufacture in accordance with yet another embodiment of the present invention.

DETAILED DESCRIPTION

Figure 4:
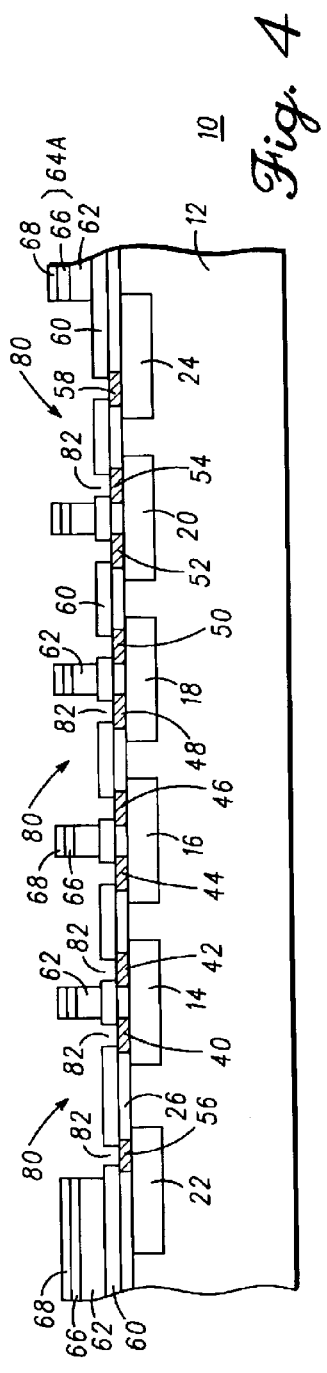

Generally, the present invention provides a semiconductor component having a light emitting device coupled to a light detecting device by a waveguide or optical interconnect, wherein the light emitting device, the light detecting device, and the waveguide are integrated with a single semiconductor chip or die. Because the light emitting device, the light detecting device, the semiconductor device, and the optical interconnect are integrated on a single semiconductor chip, they are said to be monolithically integrated. In accordance with one aspect, the semiconductor component comprises a plurality of transistors manufactured from a semiconductor substrate, where a portion of the transistors are coupled through a metallization system. The transistors are capable of communicating with the light emitting and light detecting devices through the metallization system. The optical interconnect is fabricated after the transistors and the metallization system have been fabricated. An optical interconnect is also referred to as a waveguide. An advantage of including the optical interconnect is that it improves the speed at which transistors are able to communicate with each other. This is particularly useful when transistors are located on different sides of a semiconductor chip; in this instance, communicating through a metallization system requires charging and discharging capacitances associated with the metallization system, which degrades the performance of the semiconductor device. Unlike a metallization system, an optical interconnect does not require charging or discharging of a conductive medium.

FIG. 1 is an enlarged cross-sectional side view of a semiconductor component 10 during an intermediate stage of manufacture in accordance with an embodiment of the present invention. What is shown in FIG. 1 is a portion of a semiconductor substrate 12 in which semiconductor devices 14, 16, 18, and 20 have been fabricated. Semiconductor substrate 12 has a major surface 13. It should be understood that semiconductor devices 14–20 have been shown in block form and that the type of semiconductor device is not a limitation of the present invention. Suitable semiconductor devices include active elements such as, for example, insulated gate field effect transistors, complementary insulated gate field effect transistors, junction field effect transistors, bipolar junction transistors, diodes, and the like, as well as passive elements such as, for example, capacitors, resistors, and inductors. Likewise, the material of semiconductor substrate 12 is not a limitation of the present invention. Substrate 12 can be silicon, Silicon-On-Insulator (SOI), Silicon-On-Sapphire (SOS), silicon germanium, germanium, an epitaxial layer of silicon formed on a silicon substrate, and the like. In addition, semiconductor substrate 12 may be comprised of compound semiconductor materials such as galliumarsenide, indium-phosphide, and the like.

Semiconductor substrate 12 further includes a light emitting semiconductor device 22 and a light receiving semiconductor device 24. Light receiving semiconductor devices are also referred to as light detecting semiconductor devices or light detecting devices. By way of example, light emitting device 22 is a porous silicon light emitting device. A method for manufacturing a porous silicon light emitting device is described in U.S. Pat. No. 5,466,948 issued on Nov. 14, 1995, and which is incorporated herein by reference. Other suitable light emitting devices include an amorphous silicon light emitting diode; an enhanced silicon-based light emitting device, such as a deposited amorphous silicon-carbide light emitting device; organic light emitting diodes; laser diodes; photo integrated circuits, and the like.

A suitable light detecting device is an amorphous silicon photodetector. Other suitable light detecting devices include silicon diodes, photo transistors, psi-n diodes, avalanche photo diodes, photo thyristors, photo-field effect transistors, photo-operational amplifiers, photo resistors, photo integrated circuits, and the like.

Still referring to FIG. 1, a layer of dielectric material 26 having a major surface 28 is formed on semiconductor substrate 12. A layer of photoresist 30 is formed on dielectric layer 26. Using techniques known to those skilled in the art, photoresist layer 30 is patterned to form openings 32, which expose portions of dielectric layer 26 over electrical conductors (not shown) on semiconductor devices 1620, light emitting device 22, and light receiving device 24.

Referring now to FIG. 2, the exposed portions of dielectric material 26 are etched to expose electrical conductors (not shown) on semiconductor devices 16–20, light emitting device 22, and light receiving device 24. An electrically conductive material 34 is formed on dielectric layer 26 and fills openings 32. It should be understood that electrically conductive material 34 contacts electrical conductors formed on semiconductor devices 14–20, light emitting device 22, and light detecting device 24. Thus, electrical conductor 34 does not directly contact semiconductor substrate 12 but contacts an electrical conductor such as, for example, titanium. In addition to serving as an electrical contact, the conductor prevents diffusion of metals such as copper into semiconductor substrate 12. Suitable materials for electrically conductive material 34 include copper, aluminum, and silver.

Referring now to FIG. 3, electrically conductive material 34 is planarized using, for example, a Chemical Mechanical Polishing (CMP) technique having a high selectivity to dielectric material 26. As those skilled in the art are aware, Chemical Mechanical Polishing is also referred to as Chemical Mechanical Planarization. The planarization stops on dielectric material 26. Other planarization techniques include electropolishing, electrochemical polishing, chemical polishing, and chemical enhanced planarization. After planarization, portions 40, 42, 44, 46, 48, 50, 52, 54, 56, and 58 of electrically conductive material 34 remain in the openings to form conductor-filled openings. If the conductor is metal, the filled openings are referred to as metal-filled openings. Portions 40–58 are also referred to as conductive plugs. It should be understood that conductive plugs 40–58 contact electrical conductors formed on the respective semiconductor devices 14–20, light emitting device 22, and light receiving device 24. More particularly, conductive plugs 40 and 42 are in electrical contact with corresponding conductors on semiconductor device 14; conductive plugs 44 and 46 are in electrical contact with corresponding conductors on semiconductor device 16; conductive plugs 48 and 50 are in electrical contact with corresponding conductors on semiconductor device 18; conductive plugs 52 and 54 are in electrical contact with corresponding conductors on semiconductor device 20; conductive plug 56 is in electrical contact with a corresponding conductor on light emitting device 22; and conductive plug 58 is in electrical contact with a corresponding conductor on light receiving device 24.

Still referring to FIG. 3, a layer of dielectric or insulating material 60 having a thickness ranging between approximately 1,000 Angstroms (Å) and approximately 20,000 Å is formed on dielectric material 26 and conductive plugs 40–58. Even more preferably, insulating layer 60 has a thickness ranging between 2,000 Å and 12,000 Å. By way of example, dielectric layer 60 has a thickness of about 3,000 Å and comprises a material such as, for example, silicon dioxide, TEOS, fluorinated TEOS, and hydrogenated oxidized silicon carbon material (SiCOH). Suitable organic dielectric materials include, but are not limited to polyimide, spin-on polymers, poly(arylene ether) (PAE), parylene, xerogel, fluorinated aromatic ether (FLARE), fluorinated polyimide (FPI), dense SiLK, porous SiLK (p-SiLK), polytetrafluoroethylene, and benzocyclobutene (BCB). Suitable inorganic low κ dielectric materials include, but are not limited to hydrogen silsesquioxane (HSQ), methyl silsesquioxane (MSQ), fluorinated glass, or NANOGLASS. It should be understood that the type of dielectric material for insulating layer 60 is not a limitation of the present invention and that other organic and inorganic low κ dielectric materials may be used, especially dielectric materials having a dielectric constant less than that of silicon dioxide. Similarly, the method for forming insulating layer 60 is not a limitation of the present invention. For example, insulating layer 60 may be formed using, among other techniques, spin-on coating, Chemical Vapor Deposition (CVD), Plasma Enhanced Chemical Vapor Deposition (PECVD), or Physical Vapor Deposition (PVD).

A layer of dielectric material 62 having a thickness ranging from approximately 2,000 Å to approximately 20,000 Å is formed on insulating layer 60. Suitable materials and deposition techniques for forming dielectric layer 62 are the same as those described for forming insulating layer 60. Although the material of dielectric layer 62 may be the same as that of insulating layer 60, preferably the dielectric materials are different. In addition, it is preferable that the materials of dielectric layer 62 and insulating layer 60 have different etch rates, yet have similar coefficients of thermal expansion and be capable of withstanding the stress levels brought about by processing and use as a final product.

In accordance with one embodiment, the dielectric material of insulating layer 60 is p-SILK and the material of dielectric layer 62 is silicon oxynitride. Other suitable materials for dielectric layer 62 include silicon carbide and Ensemble (Ensemble is an interlayer dielectric coating sold by The Dow Chemical Co.). These materials can be applied using a spin-on coating technique and they have similar stress level tolerances and processing temperature tolerances. Moreover, these materials can be selectively or differentially etched with respect to each other. In other words, etchants are available that selectively etch the p-SILK and silicon oxynitride, i.e., an etchant can be used to etch the p-SILK but not significantly etch the silicon oxynitride and another etchant can be used to etch the silicon oxynitride but not significantly etch the p-SILK.

In accordance with another embodiment, the dielectric material of insulating layer 60 is foamed polyimide and the dielectric material of dielectric layer 62 is HSQ layers 60 and 62 cooperate to form an insulating material. Although these embodiments illustrate the use of organic and inorganic dielectric materials to form the insulating layer, this is not a limitation of the present invention. The dielectric materials of insulating layer 60 and dielectric layer 62 can both be either organic materials or inorganic materials.

Still referring to FIG. 3, a hardmask 64 is formed on dielectric layer 62. The hardmask is also referred to as a hardmask stack or an Anti-Reflective Coating (ARC) layer. By way of example, hardmask 64 is a tri-layer system comprising silicon carbide, titanium nitride, and silicon carbide. More particularly, a layer of silicon carbide 66 having a thickness ranging between approximately 400 Å and approximately 700 Å is disposed on dielectric layer 62. A layer of titanium nitride 68 having a thickness ranging between approximately 300 Å and approximately 500 Å is disposed on silicon carbide layer 66. A layer of silicon carbide 70 having a thickness ranging between approximately 500 Å and approximately 1,000 Å is disposed on titanium nitride layer 68. Thus, titanium nitride layer 68 is sandwiched between silicon carbide layers 66 and 70. Silicon carbide layer 66 serves as an adhesion promotion layer so that titanium nitride layer 68 does not peel away from semiconductor component 10. Titanium nitride layer 68 serves as an etch stop layer during the formation of vias in insulating layer 60. Silicon carbide layer 70 lowers the reflection of light during the photolithographic steps used in patterning a photoresist layer 72.

Alternatively, hardmask 64 comprises a single layer of a dielectric material such as, for example, silicon oxynitride, silicon nitride (SiN), silicon rich nitride (SiRN), silicon carbide (SiC), or SiCOH.

A layer of photoresist 72 is formed on silicon carbide layer 70. Photoresist layer 72 is patterned to form openings 74 using techniques known to those skilled in the art.

Referring now to FIG. 4, the portions of hardmask 64, i.e., silicon carbide layer 70, titanium nitride layer 68, silicon carbide layer 66, and the portions of dielectric layer 62 that are not protected by patterned photoresist layer 72, i.e., the portions not underlying patterned photoresist layer 72, are sequentially etched using an anisotropic reactive ion etch to form openings 80. The anisotropic etch stops or terminates in or on insulating layer 60. In other words, the portions of silicon carbide layer 70, titanium nitride layer 68, silicon carbide layer 66, and dielectric layer 62 exposed by openings 74 are removed using the anisotropic reactive ion etch. Photoresist layer 72 is removed using techniques known to those skilled in the art.

Another layer of photoresist (not shown) is formed on the remaining portions of silicon carbide layer 70 and fills openings 80. The photoresist layer is patterned to form openings (not shown) that expose portions of insulating layer 60 within photoresist-filled openings 80. The exposed portions of insulating layer 60 are etched using a reactive ion etch to form inner openings 82 that expose portions of conductive plugs 40–58. Thus, the reactive ion etch stops on conductive plugs 40–58. The photoresist layer and silicon carbide layer 70 are removed using techniques known to those skilled in the art. Because the hardmask layer containing layers 66, 68, and 70 were identified by reference number 64 and at this point silicon carbide layer 70 has been partially or completely removed, the remaining portion of the hardmask has been identified by reference number 64A.

Figure 5:
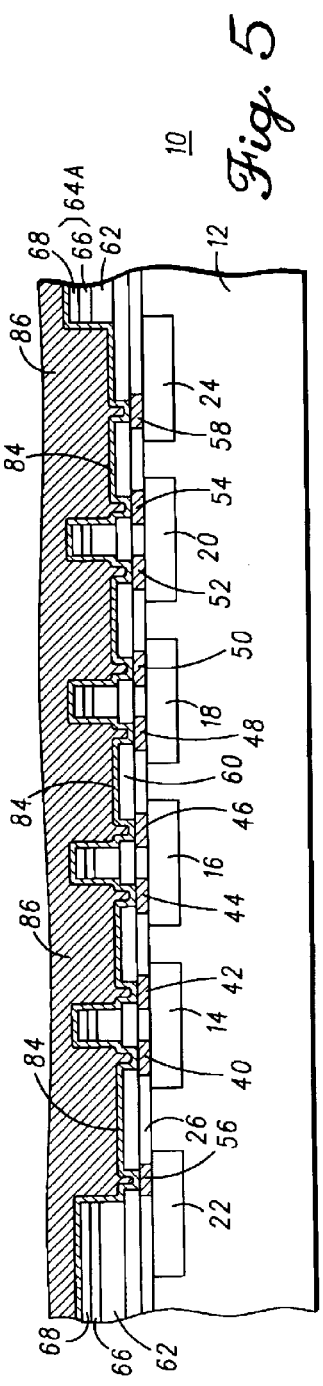

Referring now to FIG. 5, a layer of tantalum 84 having a thickness ranging between approximately 200 Å and approximately 350 Å is formed on titanium nitride layer 68 and in openings 80 and 82 (shown in FIG. 4). Tantalum layer 84 may be formed using Chemical Vapor Deposition (CVD), Plasma Enhanced Chemical Vapor Deposition (PECVD), sputtering, evaporation, or the like. Preferably, tantalum layer 84 is conformally deposited on titanium nitride layer 68 and in openings 80 and 82 to form barrier-lined openings. Tantalum layer 84 serves as a barrier layer to prevent diffusion from a subsequently deposited metal into insulating layer 60, dielectric layer 62, hardmask 64A, semiconductor devices 14–20, light emitting device 22, or light receiving device 24. In addition, tantalum layer 84 provides a low contact resistance with conductive plugs 40–58. Other suitable materials for barrier layer 84 include titanium, titanium nitride, tantalum nitride, a combination of tantalum and tantalum nitride, tungsten, tungsten nitride, titanium silicon nitride, and refractory metal compounds such as refractory metal nitrides, refractory metal carbides, or refractory metal borides.

A film or layer 86 of an electrically conductive material is formed on barrier layer 84 and fills openings 80 and 82. By way of example layer 86 is copper which is plated on barrier layer 84. Techniques for plating copper on a barrier film are known to those skilled in the art Alternatively, layer 86 may be aluminum or silver.

Figure 6:
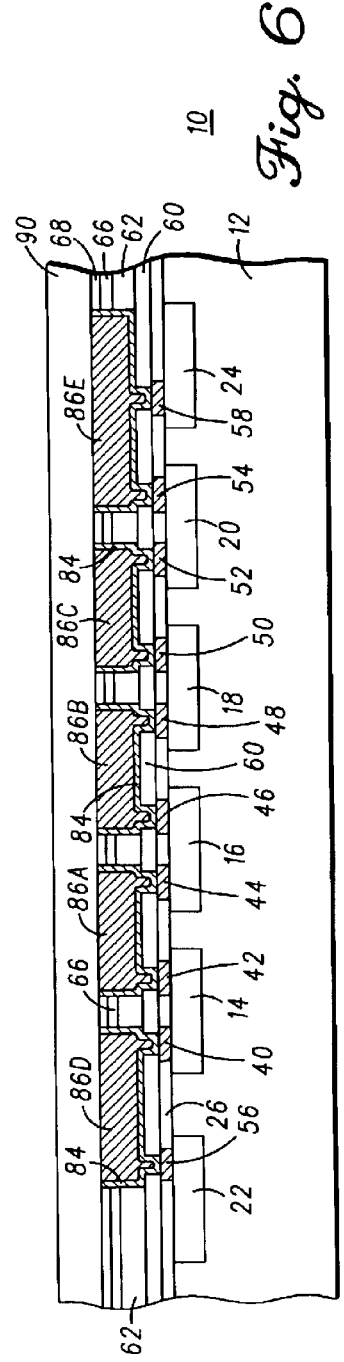

Referring now to FIG. 6, copper film 86 is pianarized using, for example, a Chemical Mechanical Polishing (CMP) technique having a high selectivity to barrier layer 84. Thus, the planarization stops on barrier layer 84. After planarization, the portion of copper film 86 electrically coupling semiconductor device 14 to semiconductor device 16 is identified by reference number 86A; the portion of copper film 86 electrically coupling semiconductor device 16 to semiconductor device 18 is identified by reference number 86B; the portion of copper film 86 electrically coupling semiconductor device 18 to semiconductor device 20 is identified by reference number 86C; the portion of copper film 86 electrically coupling semiconductor device 14 to light emitting device 22 is identified by reference number 86D; and the portion of copper film 86 electrically coupling semiconductor device 20 to light receiving device 24 is identified by reference number 86E. Other planarization techniques include electropolishing, electrochemical polishing, chemical polishing, and chemical enhanced planarization. Semiconductor devices 14 and 16 can send and receive information to and from each other via portion 86A of layer 86. Similarly, semiconductor devices 16 and 18 can send and receive information to and from each other via portion 86B of layer 86; semiconductor devices 18 and 20 can send and receive information to and from each other via portion 86C of layer 86; semiconductor device 14 and light emitting device 22 can send and receive information to and from each other via portion 86D of layer 86; and semiconductor device 20 and light receiving device 24 can send and receive information to and from each other via portion 86E of layer 86.

A layer of dielectric material 90 having a thickness ranging between approximately 1,000 Å and approximately 20,000 Å and an index of refraction ranging between approximately 1.3 and 1.6 is formed on layer 68 and on portions 86A-86F of conductive layer 86. Suitable materials for dielectric layer 90 include glass, TEOS, and the like.

Referring now to FIG. 7, a layer of photoresist (not shown) is patterned on dielectric layer 90 to form openings that expose portions of dielectric layer 90. The exposed portions of dielectric layer 90, i.e., the portions not underlying the patterned photoresist layer, are etched using, for example, an anisotropic reactive ion etch to form openings 91 and 92. The anisotropic etch stops or terminates on a light emission portion of light emitting device 22 and a light reception portion of light receiving device 24. Thus, the light emission portion and the light reception portion are exposed. The photoresist layer is removed and another layer of photoresist (not shown) is formed in openings or vias 91 and 92 and the remaining portions of dielectric layer 90. The photoresist layer is patterned to expose the portion of dielectric layer 90 that is between the photoresist filled openings 91 and 92. The exposed portion of dielectric layer 90 is etched to form a trench 93 using an anisotropic reactive ion etch. The etch is terminated such that a portion 94 of dielectric layer 90 that is between openings 91 and 92 remains. By way of example, the etch is a timed etch, i.e., the etch is terminated after a predetermined amount of time. The photoresist layer is removed using techniques known to those skilled in the art.

Referring now to FIG. 8, openings 91 and 92 and trench 93 are filled with a dielectric material 95 having an index of refraction greater than that of dielectric layer 90 and portion 94 of dielectric layer 90. In accordance with the present invention, the ratio of the dielectric constant of dielectric material 95 to that of dielectric layer 90 is greater than one. When dielectric layer 90 is glass, suitable materials for dielectric material 95 include chromium doped oxide, lead doped oxide, and barium oxide, among others. Layer of dielectric material 95 is planarized using, for example, a CM? planarization technique.

A layer of dielectric material 96 is formed on dielectric material 90 and dielectric material 95. Dielectric material 96 has an index of refraction less than that of dielectric material 95. Preferably, dielectric material 96 has the same or similar index of refraction as dielectric material 90. Thus, semiconductor component 10 includes an optical interconnect 98 disposed over the semiconductor devices and its metallization system, i.e., the metallization system is between the semiconductor devices and the optical waveguide. Dielectric layers 90, 94, 95, and 96 cooperate to form optical interconnect 98. Because dielectric layers 90, 94, and 96 have a lower index of refraction than dielectric layer 95, they serve as the cladding layer and dielectric layer 95 serves as the core of optical interconnect 98. An advantage of using an optical interconnect is that it does not have the resistance and capacitance components that introduce the RC delay that is inherent in a metal-dielectric metallization system.

In operation, semiconductor devices 14 and 16 are coupled together and are therefore capable of directly communicating with each other. In other words, semiconductor devices 14 and 16 can send and receive information to and from each other via portion 86A of layer 86. Similarly, semiconductor devices 16 and 18 can send and receive information to and from each other via portion 86B of layer 86; semiconductor devices 18 and 20 can send and receive information to and from each other via portion 86C of layer 86; semiconductor device 14 and light emitting device 22 can send and receive information to and from each other via portion 86D of layer 86; and light receiving device 24 can send and receive information to and from each other via portion 86E of layer 86. It should be understood that the routing of the metallization system is not a limitation of the present invention. In other words, the metallization system can be used to electrically couple different semiconductor devices together and a different number of semiconductor devices together. Although semiconductor devices 14 and 20 are spaced apart from each other, they can quickly and efficiently communicate with each other via optical devices 22 and 24 and optical interconnect 98. For example, semiconductor device 14 can generate an electrical signal for either further processing by semiconductor device 20 or for controlling semiconductor device 20. This electrical signal is transmitted to light emitting device 22 which converts it into a light or optical signal. The optical signal is transmitted to light detecting device 24, which converts it into an electrical signal that is routed to semiconductor device 20. To further understand the direction of light travel, arrows 99 have been included showing the direction of light travel. Because the communication signal is light and the conduction medium is optical interconnect 98, there is no RC delay caused by, for example, metal and dielectric layers, thereby improving the speed of transistor 10.

Figure 9:
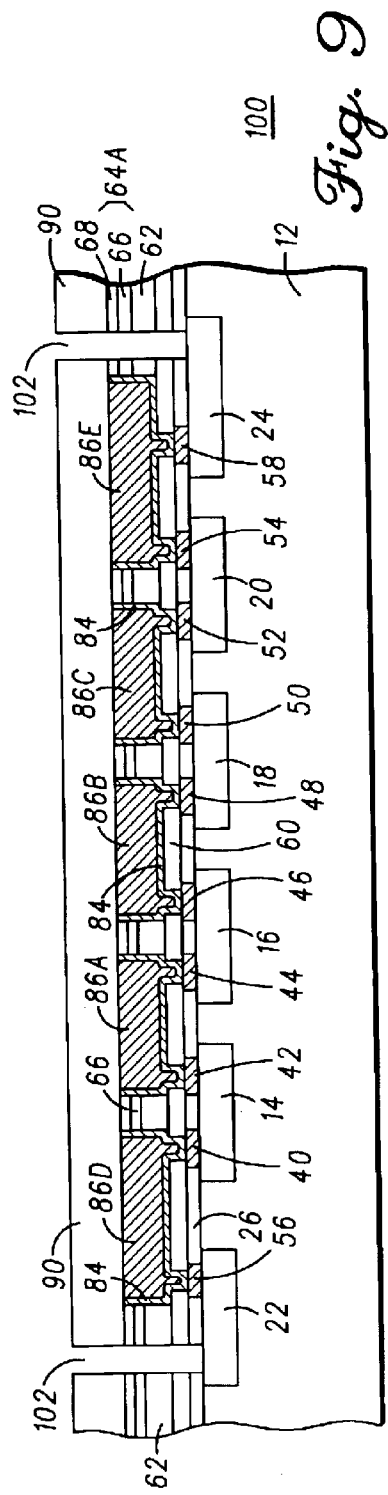

FIG. 9 is an enlarged cross-sectional side view of a semiconductor component 100 in accordance with another embodiment of the present invention. It should be understood that the beginning processing steps in the manufacture of semiconductor component 100 are the same as those described with reference to FIGS. 1–6. Accordingly, the description of FIG. 9 continues from the description of FIG. 6. A layer of photoresist (not shown) is patterned on dielectric layer 90 to form openings that expose portions of dielectric layer 90. The exposed portions of dielectric layer 90 are etched using, for example, an anisotropic reactive ion etch to form openings 102. The anisotropic etch stops or terminates on a light emission portion of light emitting device 22 and a light reception portion of light receiving device 24. Thus, the light emission portion and the light reception portion are exposed. The photomesist layer is removed.

Figure 10:
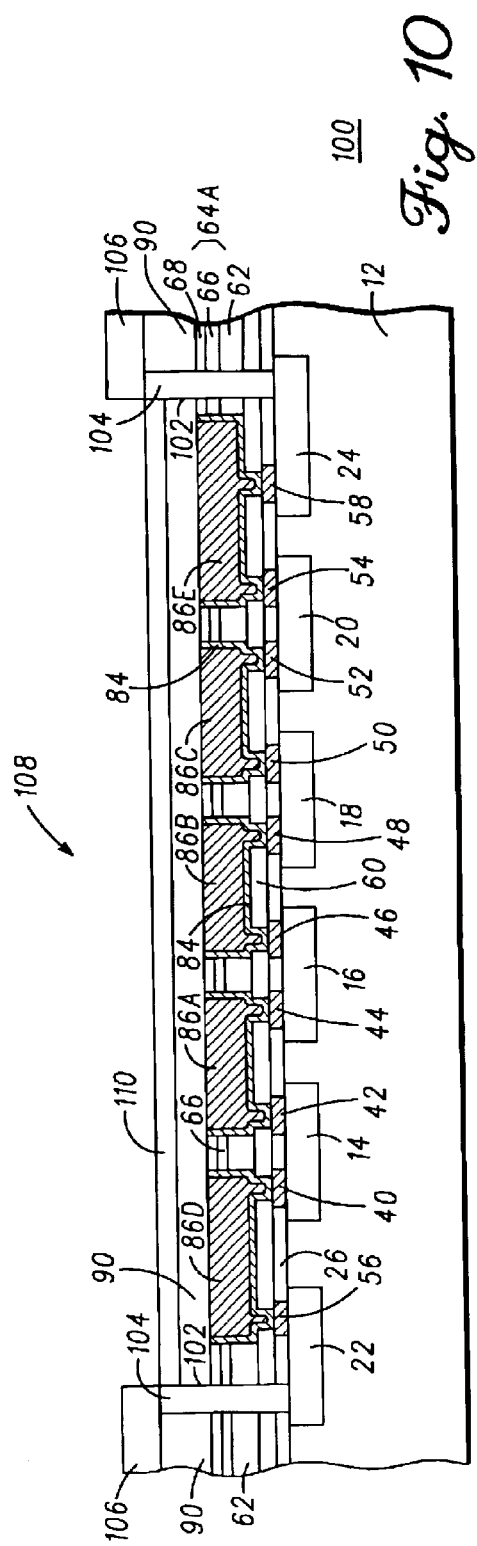

Referring now to FIG. 10, openings 102 are filled with a dielectric material 104 having a higher index of refraction than that of dielectric material 90. Suitable materials for dielectric material 104 include chromium oxide, lead oxide, barium oxide, and the like. A layer of photoresist 106 is formed on dielectric material 90 and pattern to have an opening 108 which exposes the portion of dielectric material 90 that is between dielectric material 104 that fills openings 102. A refractive index modulation species is implanted into the exposed portion of dielectric material 90, wherein the refractive index modulation species increases the index of refraction of the regions into which it is implanted. The portion of dielectric material 90 having the increased index of refraction is indicated by reference number 110. Photoresist layer 106 is removed using techniques known to those skilled in the art.

Referring now to FIG. 11, layer of dielectric material 112 is formed on dielectric materials 90 and 104, and on doped dielectric material 110. Preferably, dielectric material 112 has an index of refraction less than that of dielectric material 104 and doped dielectric material 110. Thus, a semiconductor component 100 has been provided that includes an optical interconnect 114 for transmitting information from one semiconductor component to another semiconductor component. Dielectric layers 90, 110, and 112 and dielectric material 104 cooperate to form optical interconnect 114. Because dielectric layers 90 and 112 have a lower index of refraction than dielectric layer 110 and dielectric material 104, they cooperated to form the cladding layer and dielectric layer 110 and dielectric material 104 cooperate to form the core of optical interconnect 114. To further understand the direction of light travel, arrows 119 have been included showing the direction of light travel.

The operation of semiconductor component 100 is similar to that of semiconductor component 10.

FIG. 12 is an enlarged cross-sectional side view of a semiconductor component 200 in accordance with another embodiment of the present invention. It should be understood that the beginning processing steps in the manufacture of semiconductor component 200 are the same as those described with reference to FIGS. 1–6, except that layers 62, 66, and 68 have been replaced by a single layer of dielectric material 202. Preferably, the index of refraction of dielectric material 202 is approximately the same as that of dielectric material 90. Accordingly, the description of FIG. 12 continues from the description of FIG. 6. A layer of photoresist (not shown) is patterned on dielectric layer 90 to form openings that expose portions of dielectric layer 90. A refractive index modulation species is implanted into the exposed portions of layer of dielectric material 90 and extends through dielectric material 202 and stops at light emission device 22 and light detection device 24. Suitable species for the refractive index modulation species include chromium, lead, erbium, tantalum, titanium, and the like. The modulation species increases the index of refraction of the dielectric material in regions 204 and 206, such that they serve as light or optical channels. The layer of photoresist is removed and a layer of photoresist 208 is patterned on dielectric layer 90 to form an opening that exposes portion 210 of dielectric layer 90. The refractive index modulation species is implanted into the exposed portions of layer of dielectric material 90 to form a light or optical channel 214. Patterned photoresist layer 208 is removed.

Referring now to FIG. 13, a layer of dielectric material 216 is formed on dielectric material 90, portions 204 and 206, and optical channel 214. Preferably, dielectric material 216 has an index of refraction less than that of the dielectric material of optical channel 214 and portions 204 and 206. Dielectric layers 90, 214, and 216 and portions 204 and 206 cooperate to form an optical interconnect 218. Because dielectric layers 90 and 216 have a lower index of refraction than optical channel 214 and portions 204 and 206, they serve as the cladding layer and optical channel 214 and portions 204 and 206 serve as the core of optical interconnect 218. Thus, a semiconductor component 200 has been provided that includes optical interconnect 218 for transmitting information from one semiconductor device to another semiconductor device on a semiconductor chip. To further understand the direction of light travel, arrows 219 have been included showing the direction of light travel.

Alternatively, the optical interconnect is made by implanting the refractive index modulation species into the exposed portions of layer of dielectric material 90 to a depth that is below the surface of dielectric material 90. Thus, the implanted species forms the core of the optical interconnect and dielectric material 90 serves as the cladding material. In this alternative embodiment, dielectric layer 216 is not included.

The operation of semiconductor component 200 is similar to that of semiconductor component 10.

FIG. 14 is an enlarged cross-sectional view of a semiconductor component 300 in accordance with another embodiment of the present invention. It should be understood that the beginning processing steps in the manufacture of semiconductor component 300 are the same as those described with reference to FIGS. 1–6, except that layers 62, 66, and 68 have been replaced by a single layer of dielectric material 302 and layer 90 has been replaced by silicon, which is identified by reference number 304. Accordingly, the description of FIG. 14 continues from the description of FIG. 6, where layers 62, 66, and 68 have been replaced by the single layer of dielectric material 302 and layer 90 has been replaced by silicon layer 304. A layer of photoresist 303 is patterned on silicon layer 304 to form openings 305 that expose portions of layer 304 that are over light emitting device 22 and light receiving device 24. The exposed portions of layer 304 and the underlying portions of dielectric layers 26, 60, and 302 are removed to extend the depth of openings 305, thereby exposing the light emission and the light reception portions of the respective light emitting device 22 and light receiving device 24. Photoresist layer 303 is removed. The openings are filled with a material capable of transmitting light and planarized to form a light transmission region 306. By way of example, the material of light transmission region 306 is oxide and has a higher index of refraction than that of layer 304.

Referring now to FIG. 15, a layer of photoresist 307 is formed on silicon layer 304 and patterned to have an opening 308 which exposes a portion of silicon layer 304 that is between regions 306. The exposed portion of silicon layer 304 is made porous. The horizontal porous region is identified by reference number 310. The index of refraction of porous silicon region 310 is changed to be greater than that of silicon layer 304. By way of example, the index of refraction is changed by immersing semiconductor component 300 into an organic metal compound solution that includes metal elements. The metal elements selectively dope porous silicon region 310 of silicon layer 304. Suitable metal dopants capable of increasing the index of refraction include zirconium (Zr) and titanium (Ti). At this point it may be desirable to include a metal dopant such as, for example, erbium (Er) to amplify the light signal. After doping the porous silicon, photoresist layer 307 is removed.

Referring now to FIG. 16, a layer of dielectric material 314 is formed on silicon layer 304. Preferably, dielectric material 314 has an index of refraction lower than that of the dielectric material of light transmission region 306 and porous silicon region 310 and the same or similar index of refraction to that of silicon layer 304. Silicon layer 304, light transmission region 306, and doped porous silicon region 310 cooperate to form an optical interconnect 316 having a light transmission path indicated by arrows 309. Because silicon layer 304 and dielectric material 314 have a lower index of refraction than .he material of regions 306 and 310, they serve as the cladding layer whereas region 306 and doped porous silicon region 310 serve as the core of optical interconnect 316. Thus, a semiconductor component 300 has been provided that includes an optical interconnect for transmitting information from one semiconductor component to another semiconductor component on a single semiconductor chip.

The operation of semiconductor component 300 is similar to that of semiconductor component 10.

FIG. 17 is a cross-sectional side view of a semiconductor component 400 in accordance with another embodiment of the present invention. It should be understood that the beginning processing steps in the manufacture of semiconductor component 400 are similar to those described with reference to FIGS. 1–6, except that the light emitting device and the light detecting device are formed above semiconductor substrate 12. Preferably, the light emitting and the light receiving devices are configured to be in substantially the same horizontal plane as each other and as an optical interconnect coupling them to each other. However, it should be understood the light emitting device and the light detecting device may be in different horizontal planes above semiconductor substrate 12. Because the light emitting and light detecting devices are above semiconductor substrate 12, the metal that couples semiconductor device 14 to the light emitting device is modified from that shown in FIG. 16 and the metal that couples semiconductor device 20 to the light detecting device is modified from that shown in FIGS. 1–6. Accordingly, the description of FIG. 17 continues from the description of FIG. 6. It should be understood that in the embodiment shown in FIG. 17, the light emitting and light detecting devices are not formed in or from semiconductor substrate 12 and the configuration of the electrical interconnects to the light emitting and light detecting devices is modified.

What is shown in FIG. 17 is semiconductor device 14 coupled to semiconductor device 16 via portion 86A of layer 86; semiconductor device 16 coupled to semiconductor device 18 via portion 86B of layer 86, and semiconductor device 18 coupled to semiconductor device 20 via portion 86C of layer 86. Portion 86F of layer 86 serves as an electrical interconnect to plug 40 and serves to couple semiconductor device 14 to a light emitting device (identified by reference number 426 in FIG. 19). Portion 86G of layer 86 serves as an electrical interconnect to plug 54 and serves to couple semiconductor device 20 to a light detecting device (identified by reference number 428 in FIG. 19). Layer of dielectric material 90 is formed on layer 68 and on portions 86A, 86B, 86C, 86F, and 86G of conductive layer 86. Suitable materials for dielectric layer 90 include glass, TEOS, and the like.

A layer of semiconductor material 402 is formed on dielectric layer 90. By way of example, semiconductor material 402 is amorphous silicon having a thickness ranging between approximately 1,000 Å and approximately 20,000 Å. A layer of photoresist 404 is patterned on silicon layer 402 to have openings 405 which expose portions of silicon layer 402.

Referring now to FIG. 18, the portions of amorphous silicon layer 402 that are exposed by openings 405 are oxidized. The oxidation step leaves islands of silicon 406 and 408 separated or isolated from each other by a silicon dioxide region 410. It should be understood that the type of material or method for isolating silicon islands 406 and 408 is not a limitation of the present invention. For example, rather than oxidizing silicon layer 402, the exposed portions can be removed using an anisotropic reactive ion etch and the openings created by the anisotropic etch can be filled in with a dielectric material. A light emitting device and a light detecting device are formed from islands 406 and 408, respectively. A layer of photoresist (not shown) is formed on silicon islands 406 and 408 and on silicon dioxide region 410. The photoresist layer is patterned to form openings that expose portions of silicon islands 406 and 408. The exposed portions are doped with a dopant of P-type conductivity to form doped regions 414 and 416. By way of example, doped regions 414 and 416 are formed by implanting a P-type dopant such as boron or indium into the exposed portions of silicon islands 406 and 408. The body of silicon island 406 serves as the anode of the light emitting device, where P-type doped region 414 is for making electrical contact to the anode of the light emitting device. Similarly, the body of silicon island 408 serves as the anode of the light detecting device, where P-type dope region 416 is for making electrical contact to the anode of the light detecting device.

The layer of photoresist is removed and a dielectric layer 424 is formed on silicon islands 406 and 408 and on oxide regions 410. Preferably the material of dielectric layer 424 is oxide. Openings are formed in dielectric layer 424, dielectric material 410, and dielectric material 90 to expose interconnects 86F and 86G. In addition, the openings are such that they also expose doped regions 414 and 416. The openings are formed such that doped region 414 can be electrically connected to layer 86F and doped region 416 can be electrically connected to layer 86G. Suitable techniques for forming such openings include those used in the single Damascene and dual Damascene metallization schemes. The opening that exposed doped region 414 and layer 86F, the opening that exposed doped region 416 and layer 86G, and silicon dioxide regions 410 are lined with a barrier layer such as, for example, titanium. A film or layer of an electrically conductive material is formed on the barrier layer and fills the openings. By way of example, the electrically conductive material is copper which is plated on the barrier layer. Techniques for plating copper on a barrier film are known to those skilled in the art. Alternatively, the conductive material may be aluminum or silver.

The copper film is planarized using, for example, a Chemical Mechanical Polishing (CMP) technique having a high selectivity to the silicon dioxide material 410. Thus, the planarization stops on silicon dioxide layer 410. After planarization, portion 430 of the barrier layer lines the opening that exposed interconnect portion 86F, and interconnect portion 432 of the copper film fills the opening. Similarly, portion 430A of the barrier layer lines the opening that exposed interconnect portion 86G, and interconnect portion 432A of the copper film fills the opening. Accordingly, portions 430 and 86F electrically couple light emitting device 426 to semiconductor device 14 and portions 430A and 86G electrically couple light detecting device 428 to semiconductor device 20.

Referring now to FIG. 19, a layer of photoresist (not shown) is patterned on interconnect portions 86F and 86G and on oxide layer 424, leaving a portion of oxide layer 424 over silicon island 408 exposed. Subsequently, the portion of oxide layer 424 over silicon island 408 is removed and an N+ diffusion region 448 is formed in portion 408 that serves as the cathode of light detecting device 428. Because N+ diffusion region 448 serves as the cathode of light detecting device 428, it is coupled to other on-chip devices or to other signal sources which have not been shown for the sake of clarity.

The layer of photoresist is removed and another layer of photoresist (not shown) is patterned on interconnect portions 86F and 86G and on oxide layer 424 leaving the portion of oxide layer 424 above silicon island 406 exposed. Subsequently, a portion of oxide layer 424 over silicon island 406 is removed and a portion 440 of silicon island 406 is made porous using techniques known to those skilled in the art. An N-type transparent indium tin oxide (ITO) layer 444 is formed on porous silicon portion 440. ITO layer 444 serves as a cathode of light emitting device 426 and emits the light generated by porous silicon portion 440. Although not shown, it should be understood that ITO layer 444 is coupled to other on-chip devices or to other signal sources.

The layer of photoresist and the portions of oxide layer 424 between portions 432 and 432A of the copper film are removed. A layer of dielectric material 450 is formed over light emitting device 426, light detecting device 428, and dielectric layer 90. Dielectric layer 450 has an index of refraction greater than that of dielectric layer 90. In accordance with the present invention, the ratio of the index of refraction of dielectric material 450 to that of dielectric layer 90 is greater than one. When dielectric layer 90 is glass, suitable materials for dielectric material 450 include chromium doped oxide, lead doped oxide, and barium oxide, among others. Layer of dielectric material 450 is planarized using, for example, a CMP planarization technique.

A layer of dielectric material 452 is formed on dielectric material 450. Dielectric material 452 has an index of refraction less than that of dielectric material 450. Preferably, dielectric material 452 has the same or similar index of refraction as dielectric material 90. Thus, semiconductor component 400 includes an optical interconnect disposed over the semiconductor devices and its metallization system, i.e., the metallization system is between the semiconductor devices and the optical interconnect. Dielectric layers 90, 450, and 452 cooperate to form an optical interconnect 454. Because dielectric layers 90 and 452 have a lower index of refraction than dielectric layer 450, they serve as the cladding layer and dielectric layer 450 serves as the core of optical interconnect 454. Although not completely co-planar, light emitting device 426, light detecting device 428, and optical interconnect 454 are substantially co-planar with each other. To further understand the direction of light travel, arrows 419 have been included showing the direction of light travel.

The operation of semiconductor component 400 is similar to that of semiconductor component 10.

FIG. 20 illustrates an enlarged cross-sectional side view of a semiconductor component 500 in accordance with yet another embodiment of the present invention. Semiconductor component 500 comprises silicon islands 406 and 408 formed as described with reference to FIGS. 17 and 18. Silicon islands 406 and 408 are doped such that regions 504 and 506 of silicon islands 406 and 408, respectively, are doped with a P-type dopant such as, for example, boron, and regions 508 and 510 of silicon islands 406 and 408, respectively, are doped with an N-type dopant such as, for example, phosphorus. Lines 505 and 509 indicated the P-N junctions formed between the doped regions 504 and 508 and between doped regions 506 and 510, respectively. Although not shown, regions 508 and 510 are coupled to other on-chip devices or to other signal sources. Thus, an optical emission device 501 is formed from silicon island 406 and an optical detection device 503 is formed from silicon island 408, where optical devices 501 and 503 are vertically spaced apart from the major surface of semiconductor substrate 12. Regions 508 and 510 are optically coupled to each other via an optical interconnect material 512. A layer of dielectric material 514 is disposed over optical interconnect material 512, silicon islands 406 and 408, and interconnect portions 432 and 432A. Optical interconnect material 512 has an index of refraction greater than that of dielectric layers 90 and 514. In accordance with the present invention, the ratio of the index of refraction of optical interconnect material 512 to that of dielectric layer 90 is greater than one. Likewise, the ratio of the index of refraction of optical interconnect material 512 to that of dielectric layer 514 is greater than one. Preferably, dielectric layers 90 and 514 have substantially the same index of refraction. When dielectric layers 90 and 514 are glass, suitable materials for optical interconnect material 512 include chromium doped oxide, lead doped oxide, and barium oxide, among others. Because dielectric layers 90 and 514 have a lower index of refraction than optical interconnect material 512, they serve as the cladding layer of an optical interconnect 516, whereas optical interconnect material 512 serves as the core of optical interconnect 516. Light or an optical signal travels from light emission device 501 to light detection device 503. The direction of light travel is shown by arrows 519. Thus, optical or light emission and detection devices 501 and 503 and the optical transmission path are in the same plane, i.e., co-planar. Further, light emission and detection devices 501 and 503 and the optical transmission path are vertically spaced apart from semiconductor substrate 12. It should be understood that although cladding layers 90 and 514 cooperate with optical interconnect material 512 to form a waveguide, the light emission path is co-planar with optical emission and detection devices 501 and 503.

By now it should be appreciated that a semiconductor component having an optical interconnect and a method for manufacturing the semiconductor component have been provided. The method includes forming an optical interconnect over a semiconductor material from which semiconductor devices are fabricated. The method is readily integrated into a semiconductor manufacturing process flow. An advantage of including the optical interconnect is that it improves the processing speed of the semiconductor component by replacing the metal interconnect system with an optical interconnect system. Moreover, the present method provides versatility by allowing the use of a metal interconnect system where the interconnect lengths may be short and an optical interconnect system where the interconnect lengths may be long. Preferably, the optical interconnect length ranges between about 100 microns and about 10,000 microns. By way of example, the optical interconnect length is 500 microns. However, the present invention is suitable for optical interconnect lengths of greater than 10,000 microns. Longer metal interconnects require additional charging of the metal interconnect lines, which slows down the semiconductor component In addition to increasing the speed of the semiconductor component, the present invention offers a power advantage because optical communication does not entail charging and discharging the resistances and capacitances of metallic interconnects.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law. For example, rather than increasing the index of refraction of a portion of a material to create the optical interconnect, the optical interconnect may be created by lowering the index of refraction of the material adjacent the light transmission portion of the optical interconnect.

What is claimed is:

1. A method for manufacturing a semiconductor component, comprising:
   providing a semiconductor substrate having a major surface;
   forming a first semiconductor device from the semiconductor substrate;
   forming a metallization system over the major surface;
   forming a light emitting device from or over the semiconductor substrate;
   forming a light detecting device from or over the semiconductor substrate; and
   forming an optical interconnect over the major surface, wherein the optical interconnect includes a light transmission path for coupling the light emitting device to the light detecting device, wherein the metallization system is vertically positioned between the major surface and the optical interconnect, and wherein the semiconductor device is electrically coupled to at least one of the light emitting device and the light detecting device.

2. The method of claim 1, wherein the metallization system is electrically coupled to the first semiconductor device.

3. The method of claim 1, wherein the first semiconductor device is selected from the group of semiconductor devices consisting of a field effect transistor, a bipolar junction transistor, a resistor, a capacitor, and an inductor.

4. The method of claim 1, wherein the light emitting device and the light detecting device are vertically spaced apart from the major surface.

5. The method of claim 4, wherein the light emitting device and the light detecting device are co-planar.

6. The method of claim 4, wherein the light emitting device, the light detecting device, and the light transmission path are co-planar.

7. The method of claim 1, further includes providing a second semiconductor device, the second semiconductor device electrically coupled to the first semiconductor device.

8. The method of claim 7, wherein forming the optical interconnect comprises:
   forming a first layer of dielectric material above the major surface, the first layer of dielectric material having an index of refraction; and
   forming a second layer of dielectric material over the first layer of dielectric material, the second layer of dielectric material having an index of refraction that is greater than the index of refraction of the first layer of dielectric material.

9. The method of claim 8, wherein forming the second layer of dielectric material includes increasing the index of refraction of the second layer of dielectric material.

10. The method of claim 9, wherein increasing the index of refraction includes doping the second layer of dielectric material with a refractive index modulation species.

11. The method of claim 10, wherein the refractive index modulation species is selected from the group of species consisting of lead, chromium, erbium, titanium, and tantalum.

12. The method of claim 7, wherein forming the optical interconnect comprises:
   providing a layer of dielectric material above the major surface; and
   doping a portion of the layer of dielectric material with a refractive index modulation species, the portion within the first layer of dielectric material, wherein the doped portion of the layer of dielectric material serves as a core region and the undoped region of the layer of dielectric material serves as a cladding region.

13. The method of claim 9, wherein forming the optical interconnect comprises:
   forming one of an amorphous silicon or a porous silicon above the major surface; and
   diffusing a dopant into the one of the amorphous silicon or the porous silicon.

14. A method for manufacturing a semiconductor component, comprising:
   providing a semiconductor substrate having a major surface;
   forming first and second semiconductor devices from the semiconductor substrate;
   forming a light emitting device, wherein the light emitting device is electrically coupled to the first semiconductor device;
   forming a light detecting device, wherein the light detecting device is electrically coupled to the second semiconductor device;
   forming a metallization system over the first and second semiconductor devices, and
   forming an optical interconnect over the major surface, wherein the optical interconnect optically couples the light emitting device to the light detecting device, wherein the metallization system is vertically positioned between the first and second semiconductor devices and the optical interconnect, and wherein the light emitting device and the light detecting device are laterally spaced apart by at least 100 microns.

15. The method of claim 14, wherein forming the optical interconnect comprises:
   forming a first cladding layer above the major surface;
   forming a core region over the cladding layer; and
   forming a second cladding layer over the core region, wherein the first cladding layer, the core region, and the second cladding layer cooperate to form the optical interconnect.

16. The method of claim 15, wherein forming the optical interconnect includes:
   forming a first layer of dielectric material having an index of refraction, wherein the first layer of dielectric material serves as the first cladding layer;
   forming a layer of material having an index of refraction, wherein the layer of material serves as the core region; and
   forming a second layer of dielectric material having an index of refraction over the core region, wherein the second layer of dielectric material serves as the second cladding layer, and wherein the index of refraction of the layer of material is greater than the indices of refraction of the first and second layers of dielectric material.

17. The method of claim 16, wherein forming the layer of material includes increasing the index of refraction of the layer of material by doping the layer of material with a species selected from the group of species consisting of lead, chromium, erbium, titanium, and tantalum.

* * * * *